US011610762B2

(12) United States Patent
Kusunoki (10) Patent No.: US 11,610,762 B2
(45) Date of Patent: Mar. 21, 2023

(54) PLASMA PROCESSING APPARATUS AND POWER SUPPLY METHOD

(71) Applicant: Tokyo Electron Limited, Tokyo (JP)

(72) Inventor: Atsuki Kusunoki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 51 days.

(21) Appl. No.: 17/444,484

(22) Filed: Aug. 5, 2021

(65) Prior Publication Data
US 2022/0051874 A1 Feb. 17, 2022

(30) Foreign Application Priority Data
Aug. 11, 2020 (JP) .............................. JP2020-135789

(51) Int. Cl.
*H01J 37/32* (2006.01)

(52) U.S. Cl.
CPC .. *H01J 37/32146* (2013.01); *H01J 37/32128* (2013.01); *H01J 37/32568* (2013.01); *H01J 37/32715* (2013.01)

(58) Field of Classification Search
CPC ................ H01J 37/32; H01J 37/32091; H01J 37/32128; H01J 37/32146; H01J 37/32174; H01J 37/32568; H01J 37/32715; H01J 37/32532; H01J 2237/332; H01J 2237/334; H01L 21/67; H01L 21/67011; H01L 21/67069; H05H 1/46
See application file for complete search history.

(56) References Cited

U.S. PATENT DOCUMENTS

2016/0247666 A1* 8/2016 Urakawa ........... H01J 37/32715

FOREIGN PATENT DOCUMENTS

JP 2016-157735 9/2016

* cited by examiner

*Primary Examiner* — Henry Luong
(74) *Attorney, Agent, or Firm* — IPUSA, PLLC (57) ABSTRACT

A plasma processing apparatus includes a process chamber; a mounting stage; first and second electrodes; first and second high frequency power sources, wherein the first power source supplies a waveform of one of a first pulse wave having high and low levels of first high frequency power or a continuous wave in the first period, supplies a waveform of the other in the second period, and stepwise or continuously changes the low level of the first pulse wave in the transition period, wherein the second power source supplies a waveform of one of a second pulse wave having high and low levels of second high frequency power or a continuous wave in the first period, supplies a waveform of the other in the second period, and stepwise or continuously changes the low level of the second pulse wave in the transition period.

7 Claims, 7 Drawing Sheets

PLASMA PROCESSING APPARATUS AND POWER SUPPLY METHOD

CROSS-REFERENCE TO RELATED APPLICATION

The present application is based upon and claims priority to Japanese Patent Application No. 2020-135789, filed on Aug. 11, 2020, the entire contents of which are incorporated herein by reference.

BACKGROUND OF THE INVENTION

1. Field of the Invention

The present disclosure relates to a plasma processing apparatus and a power supply method.

2. Background Art

For example, Patent Document 1 describes applying, on a mounting table, a pulse wave of high frequency electric power for plasma generation and a pulse wave of high frequency electric power for bias such that a predetermined phase difference is provided. In Patent Document 1, a duty ratio of the high frequency electric power for plasma generation is controlled to be greater than or equal to a duty ratio of the high frequency electric power for bias.

PRIOR ART DOCUMENT

[Patent Document]
[Patent Document 1] Japanese Laid-open Patent Publication No. 2016-157735

One aspect of the present disclosure provides a plasma processing apparatus and a power supply method that can stabilize plasma.

SUMMARY OF THE INVENTION

According to one aspect of the present disclosure, a plasma processing apparatus includes: a process chamber; a mounting stage that is arranged within the process chamber; a first electrode that is arranged on the mounting stage; a second electrode that is arranged to face the first electrode; a first high frequency power source that is connected to the first electrode; and a second high frequency power source that is connected to the first electrode or the second electrode. Among a first period, a second period, and a transition period between the first period and the second period that are successive, the first high frequency power source is configured to supply a waveform of one of a first pulse wave having a high level and a low level of first high frequency power or a continuous wave of the first high frequency power in the first period, the first high frequency power source is configured to supply a waveform of the other of the first pulse wave and the continuous wave of the first high frequency power in the second period, and the first high frequency power source is configured to stepwise or continuously change the low level of the first pulse wave in the transition period. The second high frequency power source is configured to supply a waveform of one of a second pulse wave having a high level and a low level of second high frequency power or a continuous wave of the second high frequency power in the first period, the second high frequency power source is configured to supply a waveform of the other of the second pulse wave and the continuous wave of the second high frequency power in the second period, and the second high frequency power source is configured to stepwise or continuously change the low level of the second pulse wave in the transition period.

According to one aspect, it is possible to provide a plasma processing apparatus and a power supply method that can stabilize plasma.

DESCRIPTION OF THE EMBODIMENTS

In the following, an embodiment for carrying out the present disclosure will be described with reference to the drawings. In each drawing, the same components are indicated by the same reference numerals and overlapping descriptions may be omitted.

[Plasma Processing Apparatus]

Figure 1:
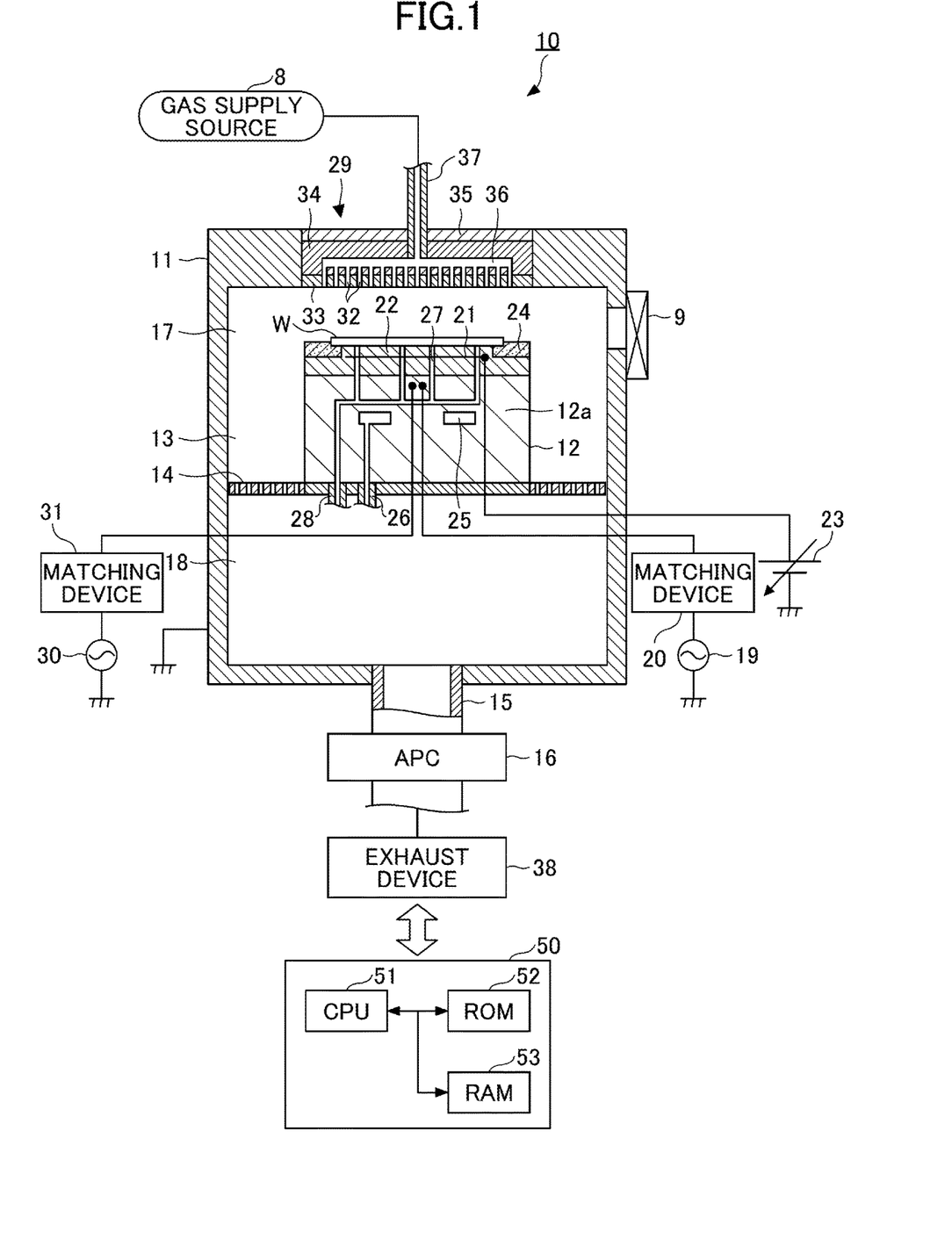
FIG. 1 is a schematic cross-sectional view illustrating an example of a plasma processing apparatus according to one embodiment.

A plasma processing apparatus 10 according to one embodiment will be described with reference to FIG. 1. FIG. 1 is a schematic cross-sectional view illustrating an example of the plasma processing apparatus according to one embodiment. The plasma processing apparatus 10 includes a tubular process chamber 11 that is made of aluminum or the like and that can seal the inside. The process chamber 11 is connected to a ground potential. Inside the process chamber 11, a mounting stage 12 made of, for example, aluminum is provided. The mounting stage 12 is a cylindrical pedestal on which a substrate W is mounted, and also functions as a lower electrode. The substrate W may be, for example, a wafer.

An exhaust path 13, which is a path to discharge a gas above the mounting stage 12 to outside of the process chamber 11, is formed between a side wall of the process chamber 11 and a side surface of the mounting stage 12. An exhaust plate 14 is provided in the middle of the exhaust path 13. The exhaust plate 14 is a plate-shaped member provided with a plurality of holes, and functions as a partition plate that partitions an upper portion and a lower portion of the process chamber 11. The upper portion of the process chamber 11 partitioned by the exhaust plate 14 is a reaction room 17 in which a plasma process is performed. An exhaust device 38 is connected to an exhaust room (manifold) 18, which is at the lower portion of the process chamber 11, via an exhaust pipe 15 that exhausts the gas in the process chamber 11 and an Adaptive Pressure Control (APC) valve 16. The exhaust plate 14 catches or reflects plasma generated in the reaction room 17 to prevent leakage of the plasma to the exhaust room 18. The exhaust device 38 depressurizes the process chamber 11 by adjusting the APC valve 16 to maintain the process chamber 11 at a desired vacuum state.

A first high frequency power source 30 is connected to the mounting stage 12 via a matching device 31, and supplies high frequency electric power for bias (hereinafter, referred to as "LF" (low frequency)) of about 400 kHz to 13.56 MHz, for example, to the mounting stage 12. The matching device 31 suppresses reflection of the high frequency electric power to increase the supply efficiency of the first high frequency electric power for bias voltage.

A second high frequency power source 19 is connected to the mounting stage 12 via a matching device 20, and supplies high frequency electric power for plasma excitation (hereinafter, referred to as "HF" (high frequency)) of about 40 MHz, for example, to the mounting stage 12. The frequency of the second high frequency power is higher than the frequency of the first high frequency power. The matching device 20 suppresses reflection of the high frequency electric power to increase the supply efficiency of the second high frequency electric power HF for plasma excitation.

The mounting stage 12 includes an electrostatic chuck 22 and a lower plate 12a. The electrostatic chuck 22 is arranged at the upper portion of the plate 12a. The plate 12a is made of an electrically conductive member, such as aluminum, for example. The electrostatic chuck 22 has a substantially disc shape and has a layer made of an insulator such as ceramic. The electrostatic chuck 22 further includes a chuck electrode 21 as an inner layer of the layer made of the insulator. When mounting the substrate W of the mounting stage 12, the substrate W is placed on the electrostatic chuck 22.

A DC power source 23 is connected to the chuck electrode 21. When a DC voltage is applied to the chuck electrode 21, the substrate W is electrostatically adsorbed and maintained on the electrostatic chuck 22 due to the Coulomb force or Johnson-Rahbek force generated by the direct voltage application.

An annular edge ring 24 (also referred to as a focus ring) is placed on the mounting stage 12 so as to surround the peripheral edge of the substrate W at the stepped portion formed on the outer periphery of the electrostatic chuck 22. The edge ring 24 may be made of silicon, for example.

An annular refrigerant room 25 that extends in a circumference direction is provided inside the mounting stage 12, for example. A low temperature coolant, cooling water or GALDEN (registered trademark), for example, is circularly supplied to the refrigerant room 25 from a chiller unit via a pipe 26 for refrigerant. The mounting stage 12 cooled by the low temperature refrigerant cools the substrate W and the edge ring 24 via the electrostatic chuck 22.

On the electrostatic chuck 22, a plurality of heat-transfer gas supply holes 27 are opened. A heat-transfer gas such as a helium (He) gas is supplied to the plurality of heat-transfer gas supply holes 27 via a heat-transfer gas supply line 28. The heat-transfer gas is supplied to a gap between the electrostatic chuck 22 and the substrate W via the heat-transfer gas supply holes 27 to increase the heat transfer efficiency between the substrate W and the electrostatic chuck 22.

A shower head 29 is arranged at a ceiling portion of the process chamber 11 so as to face the mounting stage 12. The shower head 29 functions as a gas supply mechanism and an upper electrode. The shower head 29 includes an electrode plate 33 having a plurality of gas holes 32, a cooling plate 34 that detachably supports the electrode plate 33 and a cover body 35 that covers the cooling plate 34. A buffer room 36 is provided in the cooling plate 34. A gas introduction pipe 37 is connected to the buffer room 36. The gas is supplied from the gas supply source 8 via the gas introduction pipe 37 to the shower head 29, passes through the buffer room 36 and the plurality of the gas holes 32, and is supplied to the reaction room 17.

In the reaction room 17, plasma is generated from the gas supplied from the shower head 29 and a plasma process such as etching or the like is performed on the substrate W by the plasma. Each component of the plasma processing apparatus 10 is controlled by a controller 50.

The controller 50 includes a CPU 51, a ROM (Read Only Memory) 52 and a RAM (Random Access Memory) 53, and controls a desired process such as an etching process in accordance with a procedure set in a recipe stored in the RAM 53 or the like.

When an etching process is performed by the plasma processing apparatus 10 having such a configuration, the substrate W is first carried into the process chamber 11 by opening/closing the gate valve 9 and is mounted on the mounting stage 12. A DC voltage is applied from the DC power source 23 to the chuck electrode 21, and thereby, the substrate W is electrostatically absorbed on the electrostatic chuck 22. A desired gas output from the gas supply source 8 is introduced into the reaction chamber 17 from the showerhead 29 in a shower-like manner. A second high frequency power HF for plasma excitation is applied from the second high frequency power source 19 to the mounting stage 12. A first high frequency power LF for bias voltage is applied from the first high frequency power source 30 to the mounting stage 12. Plasma is generated from the gas by the high frequency power, and a plasma process is applied to the substrate W.

It should be noted that the lower plate 12a is an example of a first electrode that is arranged on the mounting stage 12. The showerhead 29 is an example of a second electrode that is arranged to face the first electrode. The first high frequency power source is connected to the first electrode. Similarly, the second high frequency power source is connected to the first electrode. Here, the second high frequency power source may be connected to the second electrode.

[Continuous Wave/Pulse Wave of High Frequency Power]

Figure 2:
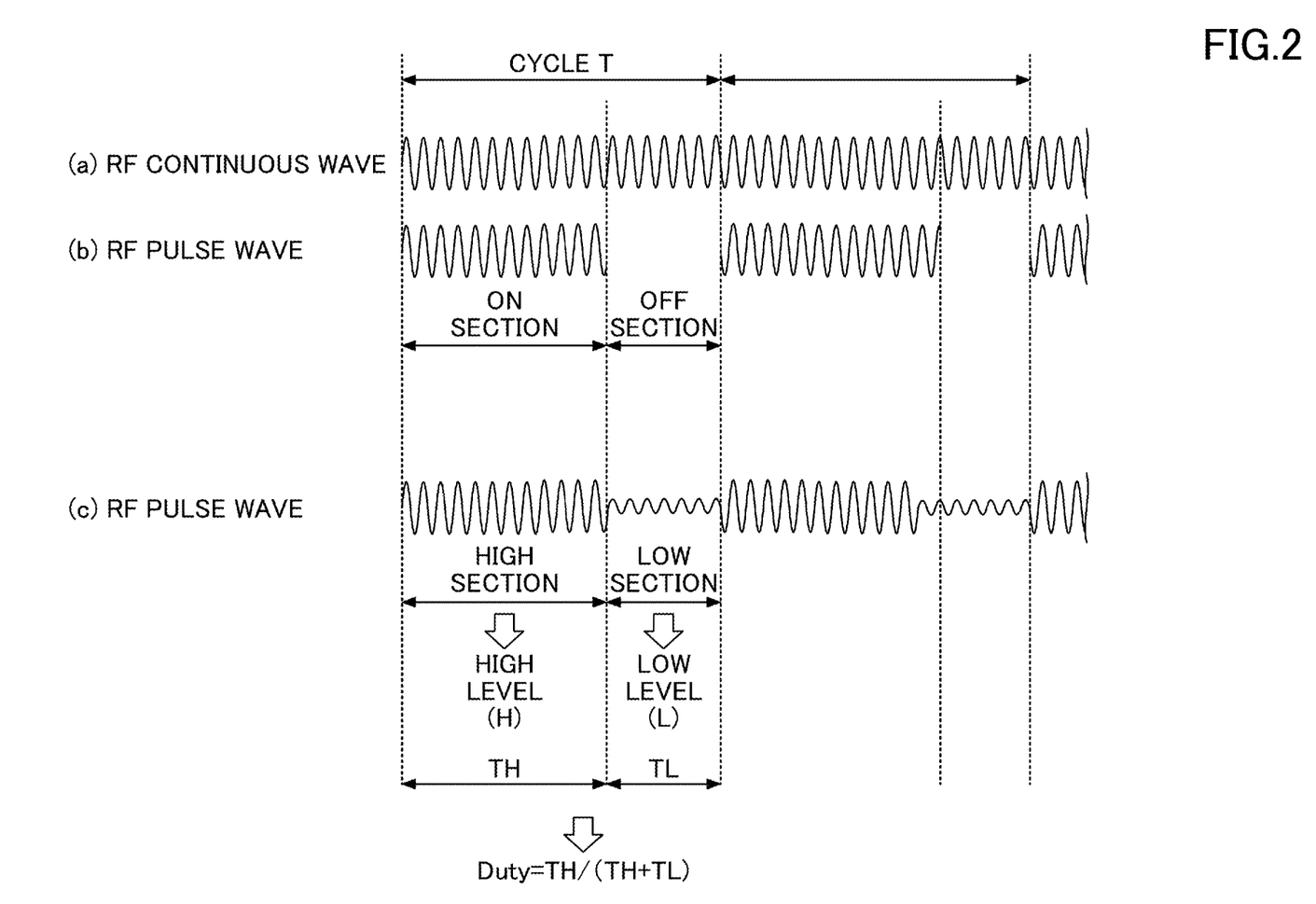
FIG. 2 is a diagram illustrating a continuous wave and a pulse wave.

The definition of a pulse wave of high frequency power will be briefly described with reference to FIG. 2. FIG. 2 is a diagram illustrating a continuous wave and a pulse wave. In FIG. 2, first high frequency power LF and second high frequency power HF are collectively referred to as "high frequency power RF".

Here, (a) of FIG. 2 illustrates a state where the high frequency power RF is applied continuously. That is, (a) of FIG. 2 illustrates a continuous wave of the high frequency power RF. Also, (b) and (c) of FIG. 2 illustrate a state in which the high frequency power RF is applied in a pulse shape. That is, (b) and (c) of FIG. 2 illustrate a pulse wave of the high frequency power RF.

At (b) of FIG. 2, a section (on section) of controlling the high frequency power RF to be turned on and a section (off section) of controlling the high frequency power RF to be turned off are repeated for each cycle T. At (c) of FIG. 2, a section (high section) of controlling the high frequency power RF to be at the high level H and a section (low section) of controlling the high frequency power RF to be at the low level L are repeated for each cycle T.

The power level of the high frequency power RF in the on section may be the same as, may be higher than, or may be lower than the power level in the high section. The power level of the high frequency power RF in the off section is 0.

The power level of the high frequency power RF in the low section is lower than the power level in the on section and includes 0 (off).

The power level of the high frequency power RF in the high section may be the same as, may be higher than, or may be lower than the power level of the high frequency power RF of the continuous wave. The high frequency power RF at the low level L applied in the low section is lower than the power level of the high frequency power RF of the continuous wave.

In the present embodiment, the high frequency power RF at the high level H of the high section includes the high frequency power RF at the power level of the on section and the high frequency power RF at the low level L of the low section includes the high frequency power RF at the power level (0) of the off section. For the high frequency power RF of the pulse wave, the time of the high section (including the on section) in which the high frequency power RF at the high level H is applied is indicated by TH and the time of the low section (including the off section) in which the high frequency power RF at the low level L is applied is indicated TL. The duty ratio is expressed by the ratio of the time TH of the high section to the sum of the time TH of the low section and the time TH of the high section for each cycle T. That is, the duty ratio is expressed by TH/(TH+TL).

[Transition of Continuous Wave/Pulse Wave of High Frequency Power]

Figure 3:
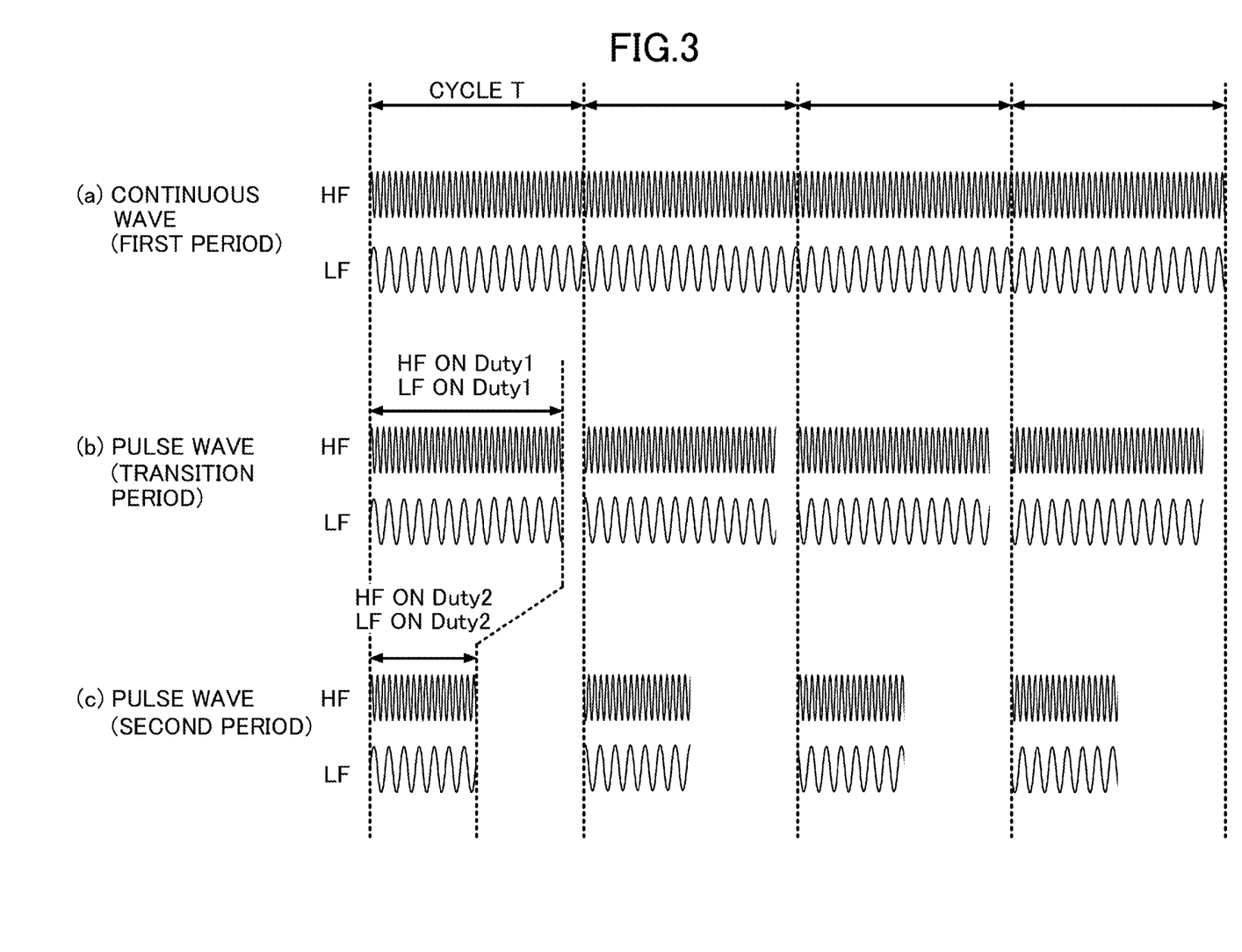
FIG. 3 is a diagram illustrating an example of transition from continuous waves to pulse waves according to Reference Example 1.

Next, a power supply method when causing first high frequency power and second high frequency power to transition from continuous waves to pulse waves or from pulse waves to continuous waves will be described with reference to Reference Examples of FIG. 3 and FIG. 4. Thereafter, a power supply method according to the present embodiment will be described.

Reference Example 1

First, a method of transitioning from continuous waves to pulse waves according to Reference Example 1 will be described with reference to FIG. 3. FIG. 3 is a diagram illustrating an example of transition from continuous waves to pulse waves according to Reference Example 1. In Reference Example 1, the case in which first high frequency power and second high frequency power are transitioned from continuous waves to pulse waves is indicated by (a) continuous wave (first period), (b) pulse wave (transition period), and (c) pulse wave (second period). It should be noted that the case in which first high frequency power and second high frequency power are transitioned from pulse waves to continuous waves can also be similarly controlled by controlling in the order of (c) pulse wave (first period), (b) pulse wave (transition period), and (a) continuous wave (second period).

In the following description and figures, the first high frequency power may also be referred to as "LF" and the second high frequency power may also be referred to as "HF". In Reference Example 1, LF and HF are controlled in synchronization. For LF and HF, the same control is repeatedly performed for each cycle T. The first period, the second period, and the transition period between the first period and the second period are successive periods in the order of the first period, the transition period, and the second period.

In Reference Example 1, when the pulse waves of LF and HF are applied, the timing and the duty ratio of the on section are controlled to be the same. Specifically, the first high frequency power source 30 supplies a waveform of one of a pulse wave having a high level and a low level of LF (hereinafter referred to as the "first pulse wave") or a continuous wave of LF in the first period. In the example of (a) of FIG. 3, the continuous wave of LF is applied in the first period.

Similarly, the second high frequency power source 19 supplies a waveform of one of a pulse wave having a high level and a low level of HF (hereinafter referred to as the "second pulse wave") or a continuous wave of HF in the first period. In the example of (a) of FIG. 3, the continuous wave of HF is applied in the first period.

Next, the first high frequency power source 30 supplies the first pulse wave at a predetermined Duty ratio having the high level and the low level of LF in the transition period. In the example of (b) of FIG. 3, the first pulse wave (pulse wave of LF) at Duty 1 is applied in the transition period. In the transition period, Duty 1 of the first pulse wave is controlled to be stepwise smaller and the on section of LF is stepwise shortened.

Similarly, the second high frequency power source 19 supplies the second pulse wave at a predetermined Duty ratio having the high level and the low level of HF in the transition period. In the example of (b) of FIG. 3, the second pulse wave (pulse wave of HF) at Duty 1 is applied in the transition period. In the transition period, Duty 1 of the second pulse wave is controlled to be stepwise smaller and the on section of HF is stepwise shortened.

In the transition period, the Duty ratio of LF and the Duty ratio of HF are controlled to be the same and the on section of LF and the on section of HF are synchronized. The Duty ratio of LF and the Duty ratio of HF are controlled to be stepwise reduced to be target values of the Duty ratios in the transition period. The target values of the Duty ratios are Duty 2 as illustrated at (c) of FIG. 3, which have been set in advance.

The first high frequency power source 30 supplies the first pulse wave of LF so as to be at the Duty ratio at the target value in the second period. In the example of (c) of FIG. 3, the first pulse wave of LF having an on time of Duty 2 at the target value is applied in the second period.

Similarly, the second high frequency power source 19 supplies the second pulse wave of HF so as to be at the Duty ratio at the target value in the second period. In the example of (c) of FIG. 3, the second pulse wave of HF having an on time of Duty 2 at the target value is applied in the second period.

Reference Example 2

In the power supply method described in Reference Example 1, LF and HF were synchronized. In Reference Example 2 described below, the LF and the HF are controlled not to be synchronized and are controlled to be offset for a predetermined period of time (see Offset illustrated at (b) of FIG. 4). FIG. 4 is a diagram illustrating an example of transition from continuous waves to pulse waves according to Reference Example 2.

In Reference Example 2, the timing of the pulse on is shifted between LF and HF, and the Duty ratio is controlled independently. Specifically, as illustrated at (a) of FIG. 4, the first high frequency power source 30 applies a continuous wave of LF in the first period, and the second high frequency power source 19 applies a continuous wave of HF in the first period.

Figure 4:
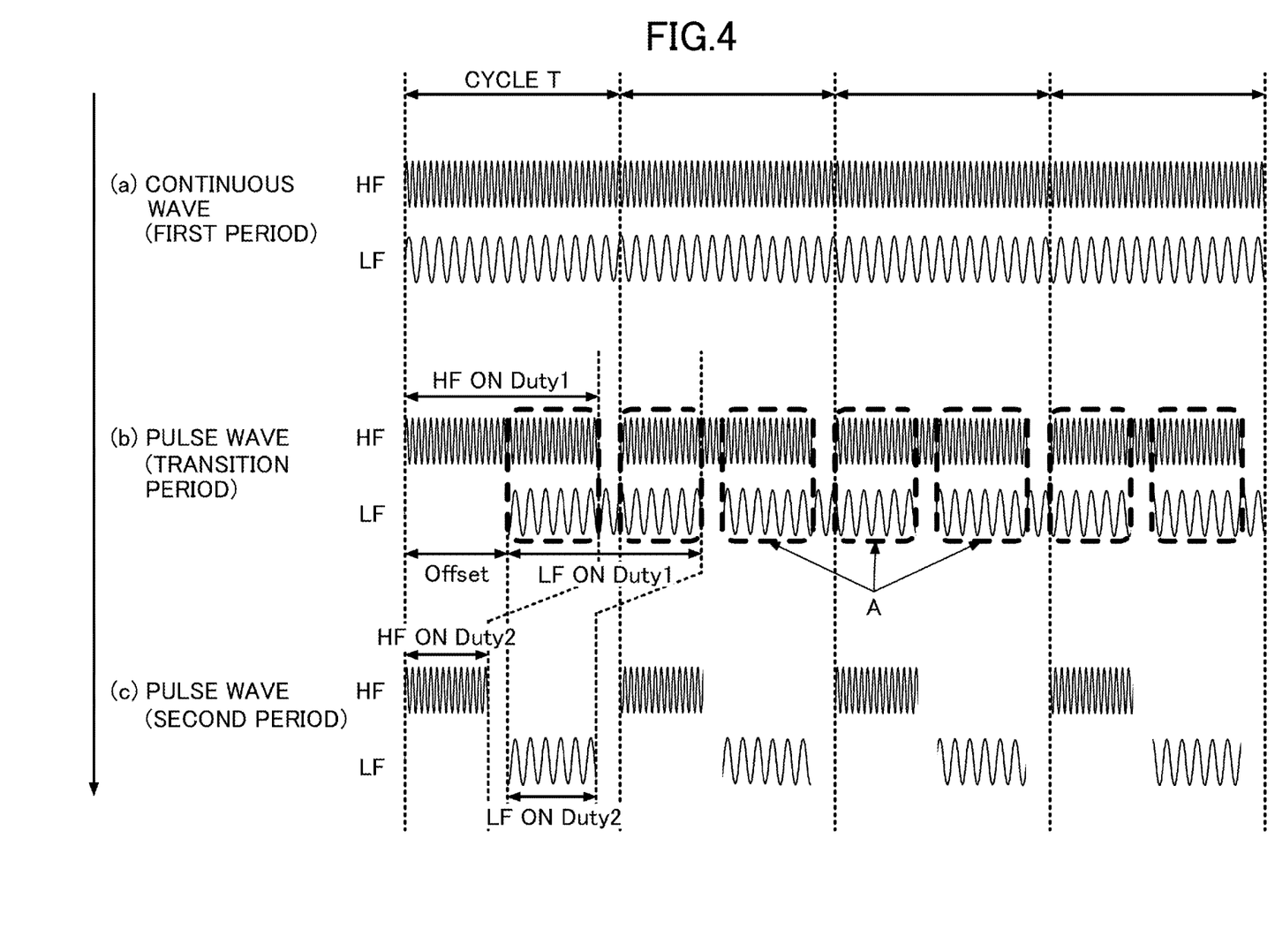
FIG. 4 is a diagram illustrating an example of transition from continuous waves to pulse waves according to Reference Example 2.

Next, the first high frequency power source 30 supplies the first pulse wave at Duty 1 in the transition period illustrated at (b) of FIG. 4. Similarly, the second high frequency power source 19 supplies the second pulse wave at Duty 1 during in transition period.

In the transition period, the duty ratio of LF and the duty ratio of HF are controlled to be the same, and the on section of LF and the on section of HF are not synchronized and are offset. Duty 1 is stepwise or continuously changed in the transition period. In the example of (b) of FIG. 4, Duty 1 is stepwise or continuously reduced in the transition period so as to be target values of the Duty ratios. The target values of the Duty ratios are Duty 2 as illustrated at (c) of FIG. 4, which have been set in advance.

The first high frequency power source 30 supplies a first pulse wave of LF at Duty 2 at the target value in the second period. Similarly, the second high frequency power source 19 supplies a second pulse wave of HF at Duty 2 at the target value in the second period.

In Reference Example 2, in the transition from the continuous waves to the pulse waves of LF and HF, the Duty ratios are stepwise or continuously changed to be the target values. As a result, the effective power of LF and HF applied to the mounting stage 12 is stepwise changed to reduce the fluctuation of the plasma and stabilize the plasma.

However, in Reference Example 2, as compared with Reference Example 1, the overlapping period where the ON section of LF and the ON section of HF overlap changes with time. For this reason, impedance matching cannot be performed stably due to the fluctuation in plasma as a load, and power of HF and LF and Vpp (peak-to-peak voltage) become temporarily unstable. This results in a plasma unstable state.

In contrast, a power supply method according to one embodiment, which will be described next, the power levels of LF and HF are stepwise or continuously changed in the low section of LF and the low section of HF. Thereby, it is possible to reduce the fluctuation of the plasma load and stabilize the plasma.

(Embodiment)

Figure 5:
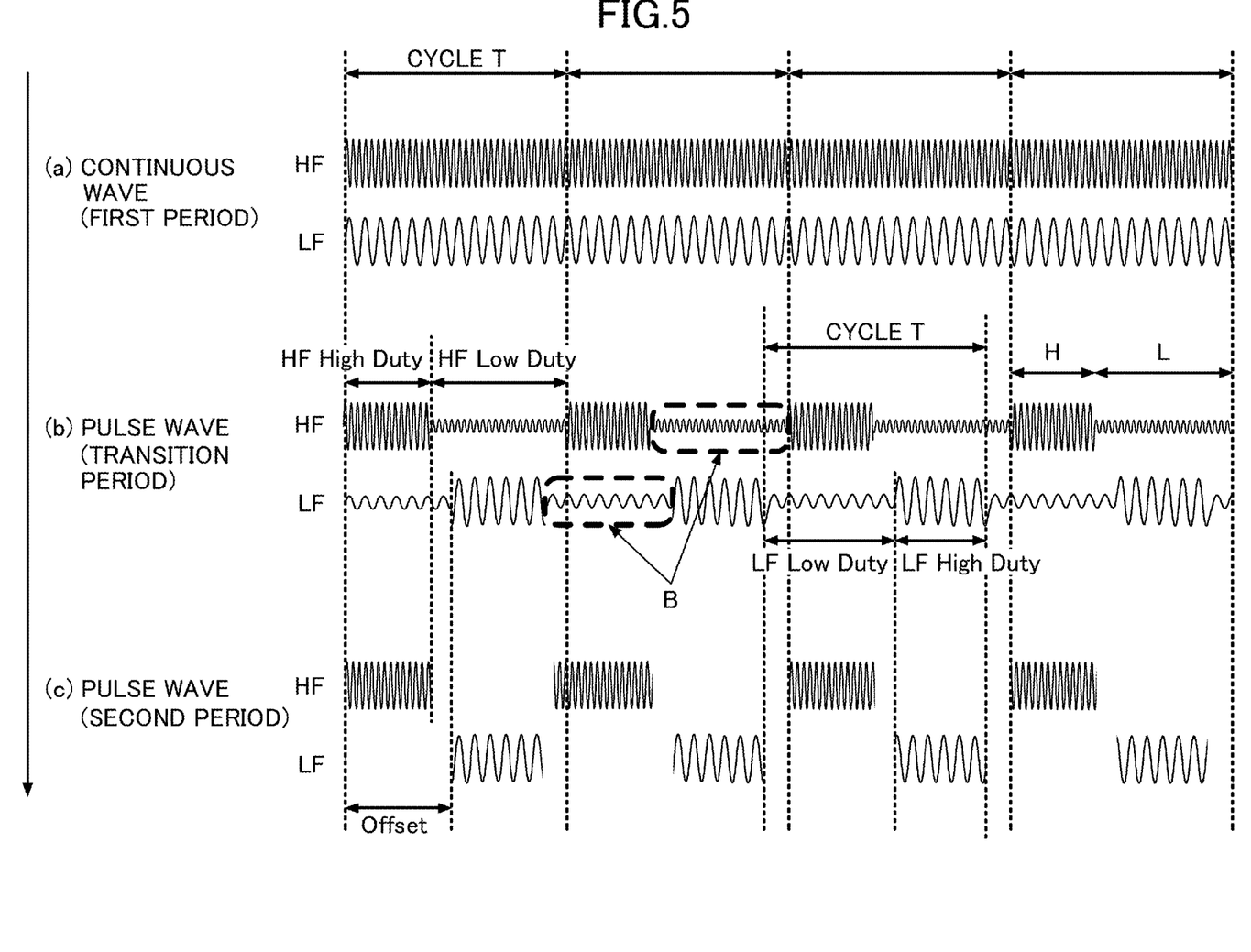
FIG. 5 is a diagram illustrating an example of transition from continuous waves to pulse waves according to one embodiment.

Transition from continuous waves to pulse waves according to one embodiment will be described with reference to FIG. 5. FIG. 5 is a diagram illustrating an example of transition from continuous waves to pulse waves according to one embodiment. In the present embodiment, the case in which first high frequency power and second high frequency power are transitioned from continuous waves to pulse waves is indicated by (a) continuous wave (first period), (b) pulse wave (transition period), and (c) pulse wave (second period). It should be noted that the case in which first high frequency power and second high frequency power are transitioned from pulse waves to continuous waves can also be similarly controlled by controlling in the order of (c) pulse wave (first period), (b) pulse wave (transition period), and (a) continuous wave (second period).

For LF and HF, the same control is repeatedly performed for each cycle T. The first period, the second period, and the transition period between the first period and the second period are successive periods. The on section of LF and the on section of HF are not synchronized and are offset.

In the present embodiment, the first high frequency power source 30 supplies one of a waveform of a first pulse wave having a high level and a low level of LF or a continuous wave of LF in the first period. In the example of (a) of FIG. 5, the continuous wave of LF is applied in the first period.

The first high frequency power source 30 supplies a waveform of the other of the first pulse wave and the continuous wave of LF in the second period. In the example of (c) of FIG. 5, the first pulse wave (pulse wave of LF) is applied in the second period. At (b) and (c) of FIG. 5, the first pulse wave is controlled at a desired Duty ratio and is not varied.

The first high frequency power source 30 stepwise or continuously changes the low level of the first pulse wave in the transition period. In the example of (b) of FIG. 5, the low level of the first pulse wave indicated by "LF Low Duty" is stepwise or continuously lowered in the transition period. At this time, the low level of the first pulse wave is stepwise or continuously lowered to be "off (0)" illustrated at (c) of FIG. 5. The high level of the first pulse wave indicated by "LF High Duty" is not varied in the transition period and the second period. The high level of the first pulse wave indicated by "LF High Duty" may be the same as the power level of the high frequency power of the continuous wave of LF at (a) of FIG. 5 or may be a different power level.

Similarly, the second high frequency power source 19 supplies a waveform of one of a second pulse wave having a high level and a low level of HF or a continuous wave of HF in the first period. In the example of (a) of FIG. 5, the continuous wave of HF is applied in the first period.

The second high frequency power source 19 supplies a waveform of the other of the second pulse wave or the continuous wave of HF in the second period. In the example of (c) of FIG. 5, the second pulse wave (pulse wave of HF) is applied in the second period. At (b) and (c) of FIG. 5, the second pulse wave is controlled at a desired Duty ratio and is not varied.

The second high frequency power source 19 stepwise or continuously changes the low level of the first pulse wave in the transition period. In the example of (b) of FIG. 5, the low level of the second pulse wave indicated by "HF Low Duty" is stepwise or continuously lowered in the transition period. At this time, the low level of the second pulse wave is stepwise or continuously lowered to be "off (0)" illustrated at (c) of FIG. 5. The high level of the second pulse wave indicated by "HF High Duty" is not varied in the transition period and the second period. The high level of the first pulse wave indicated by "HF High Duty" may be the same as the power level of the high frequency power of the continuous wave of LF at (a) of FIG. 5 or may be a different power level.

In the power supply method according to the present embodiment, when causing LF and HF to transition from continuous waves to pulse waves, the duty ratios of HF and LF are not changed, but the power at the low levels of HF and LF in the low sections in the frames B indicated by the dotted lines at (b) of FIG. 5 is changed stepwise or continuously. Thereby, by stepwise or continuously changing the effective power of LF and HF applied to the plasma load, it is possible to transition from continuous waves to pulse waves or from pulse waves to continuous waves without impairing the stability of the plasma load.

In particular, in the present embodiment, the first pulse wave and the second pulse wave are offset with a predetermined phase difference and are controlled so that the high level section of HF (HF High Duty) and the high level section of LF (LF High Duty) do not overlap and the Duty ratios are not changed. Thereby, while maintaining the plasma stability, it is possible to transition from continuous waves to pulse waves or from pulse waves to continuous waves. Although the high level section of HF and the high level section of LF are controlled so as not to overlap in the present embodiment, the high level section of HF and the high level section of LF may partially overlap. Also, an offset may not be provided. Even without an offset, by stepwise or continuously changing the power at the low levels of LF and HF, it is possible to transition from continuous waves to pulse waves or from pulse waves to continuous waves while maintaining the plasma stability.

It should be noted that the stepwise changing means changing the low level section of LF and the low level section of HF gradually to a value differing for each cycle T. The continuously changing means, in the low level section of LF and the low level section of HF, changing the power of the low levels of LF and HF continuously within the same cycle T, and in the low level section of adjacent cycles T, continuously changing the power of the low levels of LF and HF.

As an example of stepwise or continuously changing the low level of the first pulse wave, in a case in which LF of the first period is a continuous wave and LF of the second period is a pulse wave, the first high frequency power source 30 may lower the low level of the first pulse wave to a predetermined target value (including off). On the other hand, in a case in which LF in the first period is a pulse wave and LF in the second period is a continuous wave, the first high frequency power source 30 may increase the low level of the first pulse wave in the transition period to the high level of the first pulse wave or the level of the continuous wave of LF. In this case, the high level of the first pulse wave or the level of the continuous wave of LF is the predetermined target value.

Similarly, in a case in which HF in the first period is a continuous wave and HF in the second period is a pulse wave, the second high frequency power source 19 may lower the low level of the second pulse wave in the transition period to a predetermined target value (including off). On the other hand, in a case in which HF in the first period is a pulse wave and HF in the second period is a continuous wave, the second high frequency power source 19 may increase the low level of the second pulse wave in the transition period to the high level of the second pulse wave or the level of the continuous wave of the second high frequency power.

Although an example of controlling two power levels, the high level or the low level, for LF and HF is described, the present disclosure is not limited to this. For example, the present disclosure can be applied to pulse waves having three or more power levels.

Further, in FIG. 5, the Duty ratios of LF and HF are the same, but may be different. Also, although the power supply method in the transition period from continuous waves to pulse waves and the transition period from pulse waves to continuous waves has been described, the present disclosure is not limited to this. For example, the power supply according to the present embodiment can be applied to transition from one pulse wave to another pulse wave that differs from the one pulse wave.

[Example]

Figure 6:
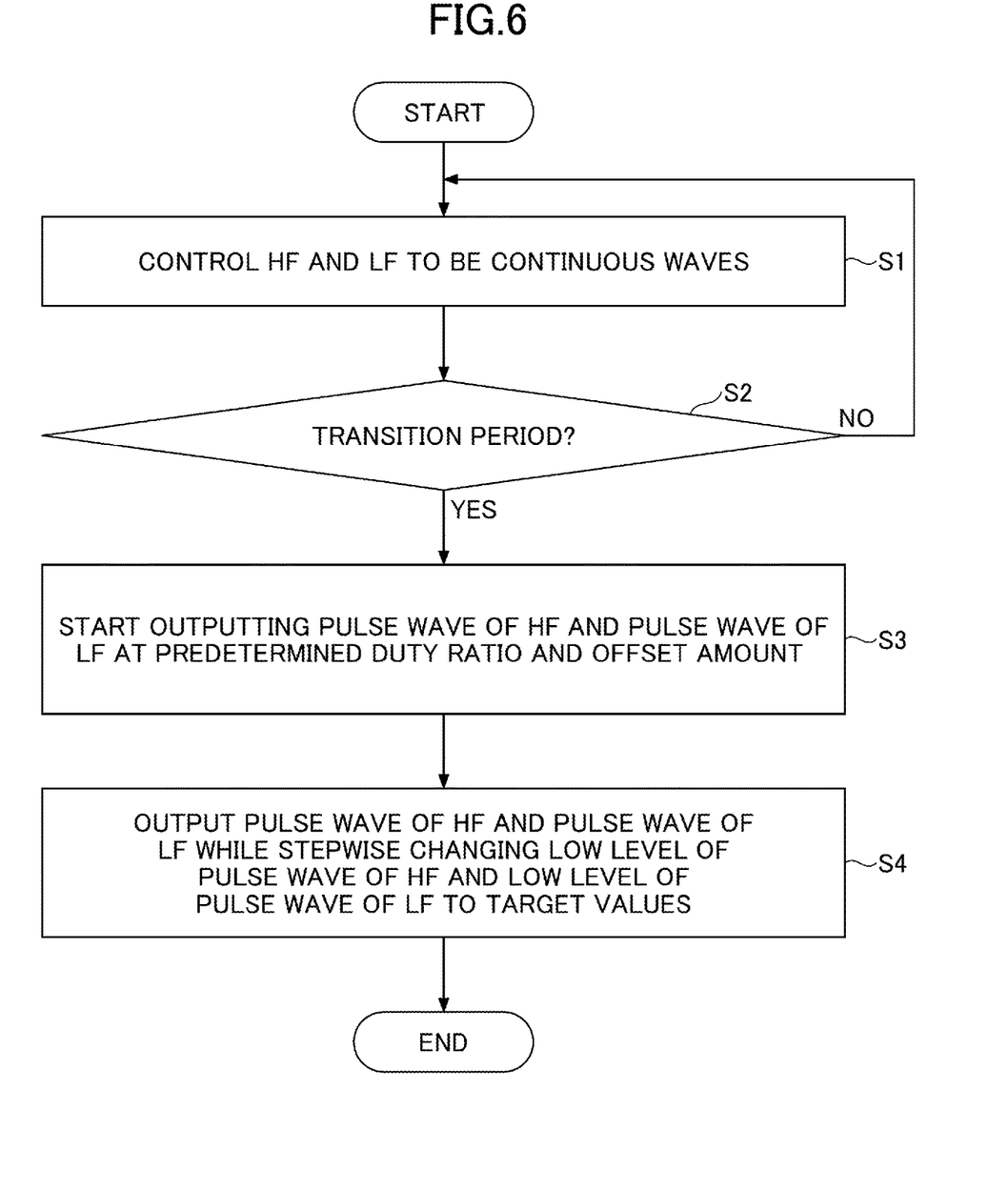
FIG. 6 is a diagram illustrating Example of the power supply method.
Figure 7:
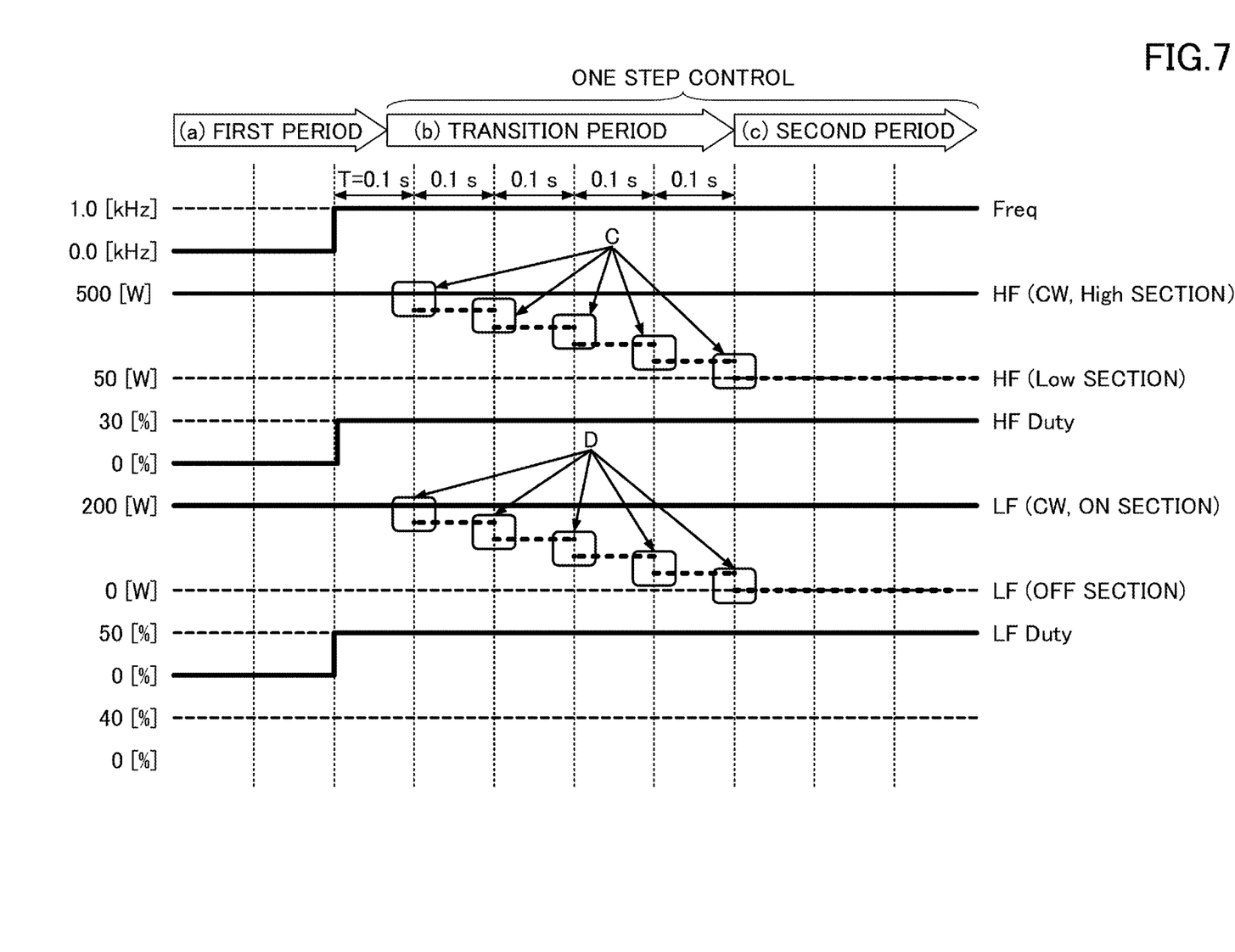
FIG. 7 is a diagram that depicts Example of the power supply method.

Finally, Example of the power supply method will be described with reference to FIG. 6 and FIG. 7. FIG. 6 is a diagram illustrating Example of the power supply method. FIG. 7 is a diagram that depicts Example of the power supply method. The process of FIG. 6 is controlled by the controller 50.

Upon the process illustrated in FIG. 6 being started, the controller 50 controls HF and LF to continuous waves in the first period (Step S1). Thus, as illustrated at FIG. 7 (a: first period), HF and LF are controlled to the continuous waves (CW) in the first period. For example, the continuous wave of HF is controlled to 500 W and the continuous wave of LF is controlled to 200 W. It should be noted that in this Example, the power level of the continuous wave and the power level of the high level section of the pulse wave are controlled to be the same.

Next, the controller 50 determines whether it is a transition period (Step S2). Upon the transition period, the controller 50 starts outputting the pulse wave of LF (first pulse wave) and the pulse wave of HF (second pulse wave) with a predetermined Duty ratio and an offset amount (step S3). Next, while stepwise changing the low level of the first pulse wave of LF and the low level of the second pulse wave of HF to predetermined target values, the controller 50 outputs the pulse wave of HF and the pulse wave of LF (Step S4) and terminates the present process. In the transition period, the low level of the first pulse wave and the low level of the second pulse wave may be changed stepwise in a time of 1 second or less. For example, in the example of FIG. 7 (b: transition period), the low level of the first pulse wave and the low level of the second pulse wave are changed stepwise for every cycle of 0.1 second in the transition period.

Thus, as illustrated by the frames C at (b) of FIG. 7, the low level of the pulse wave of HF in the transition period is controlled to be reduced stepwise for each constant period so as to be a target value in FIG. 7 (c: second period). As a result, the fluctuation of the low level (including off) of the pulse wave of HF can be gently changed.

Similarly, as illustrated by the frames D at (b) of FIG. 7, the low level of the pulse wave of LF in the transition period is controlled to be reduced stepwise for each constant period so as to be a target value of (c) in FIG. 7. As a result, the fluctuation of the low level (including off) of the pulse wave of LF can be gently changed.

As described above, according to the power supply method and the plasma processing apparatus 10 according to the present embodiment, the low levels of LF and HF are stepwise or continuously changed in the transition from continuous waves to pulse waves or from pulse waves to continuous waves. Thereby, it is possible to suppress the fluctuation of the plasma load and stabilize the plasma.

The power supply method and the plasma processing apparatus 10 according to the embodiment disclosed herein should be considered exemplary in all respects and are not limited thereto. The embodiments as described above may be changed and modified in various forms without departing from the appended claims and spirit thereof. The matters described in the embodiments as described above may take other configurations to the extent not inconsistent, and may be combined to the extent not inconsistent.

A plasma processing apparatus according to the present embodiment can be applied to any type of apparatuses such as an Atomic Layer Deposition (ALD) apparatus, a Capacitively Coupled Plasma (CCP) apparatus, an Inductively Coupled Plasma (ICP) apparatus, a Radial Line Slot Antenna (RLSA) apparatus, an Electron Cyclotron Resonance Plasma (ECR) apparatus, and a Helicon Wave Plasma (HWP) apparatus.

The plasma processing apparatus of the present disclosure can be applied to a configuration of having three or more high frequency power supplies, and the power supply method of the present disclosure can be applied to a power supply method for a transition period for the three or more high frequency power sources. Also, the plasma processing apparatus of the present disclosure can be applied to a configuration of having a high frequency power source and a microwave source, and the power supply method of the present disclosure can be applied to a power supply method for a transition period for the high frequency power source and the microwave source.

The plasma processing apparatus is not limited to an etching apparatus as long as it is an apparatus that performs a predetermined process (for example, deposition, etching, ashing, or the like) on a substrate using plasma, and may be a deposition apparatus, an ashing apparatus, a doping apparatus, or the like.

What is claimed is:

1. A plasma processing apparatus comprising:
a process chamber;
a mounting stage that is arranged within the process chamber;
a first electrode that is arranged on the mounting stage;
a second electrode that is arranged to face the first electrode;
a first high frequency power source that is connected to the first electrode; and
a second high frequency power source that is connected to the first electrode or the second electrode,
wherein the first high frequency power source is configured
among a first period, a second period, and a transition period between the first period and the second period that are successive, to supply a waveform of one of a first pulse wave having a high level and a low level of first high frequency power or a continuous wave of the first high frequency power in the first period,
to supply a waveform of the other of the first pulse wave and the continuous wave of the first high frequency power in the second period, and
to stepwise or continuously change the low level of the first pulse wave in the transition period, and
wherein the second high frequency power source is configured
to supply a waveform of one of a second pulse wave having a high level and a low level of second high frequency power or a continuous wave of the second high frequency power in the first period,
to supply a waveform of the other of the second pulse wave and the continuous wave of the second high frequency power in the second period, and
to stepwise or continuously change the low level of the second pulse wave in the transition period.

2. The plasma processing apparatus according to claim 1, wherein in a case of supplying the continuous wave of the first high frequency power and the continuous wave of the second high frequency power in the first period and supplying the first pulse wave and the second pulse wave in the second period, the first high frequency power source is configured to stepwise or continuously lower the low level of the first pulse wave to a predetermined target value in the transition period, and
wherein the second high frequency power supply is configured to stepwise or continuously lower the low level of the second pulse wave to a predetermined target value in the transition period.

3. The plasma processing apparatus according to claim 1, wherein in a case of supplying the first pulse wave and the second pulse wave in the first period and supplying the continuous wave of the first high frequency power and the continuous wave of the second high frequency power in the second period, the first high frequency power source is configured to stepwise or continuously increase the low level of the first pulse wave to the high level of the first pulse wave or a power level of the continuous wave of the first high frequency power in the transition period, and
wherein the second high frequency power source is configured to stepwise or continuously increase the low level of the second pulse wave to the high level of the second pulse wave or a power level of the continuous wave of the second high frequency power in the transition period.

4. The plasma processing apparatus according to claim 1, wherein the first pulse wave and the second pulse wave are offset with a predetermined phase difference.

5. The plasma processing apparatus according to claim 1, wherein the first high frequency power source is configured to change the low level of the first pulse wave stepwise in a time of one second or less in the transition period, and
wherein the second high frequency power source is configured to change the low level of the second pulse wave stepwise in a time of one second or less in the transition period.

6. The plasma processing apparatus according to claim 1, wherein a section of the high level of the first high frequency power does not overlap with a section of the high level of the second high frequency power.

7. A power supply method that is executed by a plasma processing apparatus, the plasma processing apparatus including a first electrode that is arranged on a mounting stage in a process chamber; a second electrode that is arranged to face the first electrode; a first high frequency power source that is connected to the first electrode; a second high frequency power source that is connected to the first electrode or the second electrode; and a controller, the power supply method causing the controller:
among a first period, a second period, and a transition period between the first period and the second period that are successive, to supply, from the first high frequency power source, a waveform of one of a first pulse wave having a high level and a low level of first high frequency power or a continuous wave of the first high frequency power in the first period;
to supply a waveform of the other of the first pulse wave and the continuous wave of the first high frequency power in the second period;
to stepwise or continuously change the low level of the first pulse wave in the transition period;
to supply, from the second high frequency power source, a waveform of one of a second pulse wave having a high level and a low level of second high frequency power or a continuous wave of the second high frequency power in the first period;
to supply a waveform of the other of the second pulse wave and the continuous wave of the second high frequency power in the second period; and
to stepwise or continuously change the low level of the second pulse wave in the transition period.

* * * * *